US012603608B2

(12) United States Patent
Uno

(10) Patent No.: US 12,603,608 B2
(45) Date of Patent: Apr. 14, 2026

(54) OSCILLATOR

(71) Applicant: SEIKO EPSON CORPORATION, Tokyo (JP)

(72) Inventor: Tomohiro Uno, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 19/002,032

(22) Filed: Dec. 26, 2024

(65) Prior Publication Data

US 2025/0219580 A1 Jul. 3, 2025

(30) Foreign Application Priority Data

Dec. 28, 2023 (JP) ................................ 2023-222298

(51) Int. Cl.

| | |
|---|---|
| *H03B 5/04* | (2006.01) |
| *G01K 1/02* | (2021.01) |
| *G01K 7/18* | (2006.01) |
| *G01K 7/22* | (2006.01) |
| *G01K 15/00* | (2006.01) |
| *H03B 5/36* | (2006.01) |
| *H03L 1/02* | (2006.01) |
| *H03L 1/04* | (2006.01) |

(52) U.S. Cl.
CPC .............. *H03B 5/04* (2013.01); *G01K 1/026* (2013.01); *G01K 7/18* (2013.01); *G01K 7/22* (2013.01); *G01K 15/007* (2013.01); *H03B 5/36* (2013.01); *H03L 1/028* (2013.01); *H03L 1/04* (2013.01)

(58) Field of Classification Search
CPC .... H03B 5/04; H03B 5/32; H03B 5/36; H03L 1/022; H03L 1/028; H03L 1/04; H03H 9/08; G01R 31/31727; G01K 1/026; G01K 7/18; G01K 7/22; G01K 15/007
See application file for complete search history.

(56) References Cited

U.S. PATENT DOCUMENTS

| | | | |
|---|---|---|---|
| 2017/0045360 A1* | 2/2017 | Nakamura | ............. H10D 48/50 |
| 2020/0021243 A1* | 1/2020 | Uehara | .................. H03B 5/368 |
| 2020/0274486 A1* | 8/2020 | Aoki | ........................ H03B 5/04 |
| 2021/0250029 A1* | 8/2021 | Matsukawa | ............... H03L 1/04 |
| 2023/0268884 A1 | 8/2023 | Seo | |

FOREIGN PATENT DOCUMENTS

JP 2023-121282 A 8/2023

* cited by examiner

*Primary Examiner* — Ryan Johnson
(74) *Attorney, Agent, or Firm* — Rankin, Hill & Clark LLP

(57) ABSTRACT

An oscillator includes a resonator element, an oscillation circuit configured to cause the resonator element to oscillate, a temperature control element configured to control a temperature of the resonator element, a plurality of temperature sensors, a failure detection circuit, and a container configured to accommodate the resonator element, the oscillation circuit, the temperature control element, the plurality of temperature sensors, and the failure detection circuit. The failure detection circuit performs failure detection for the plurality of temperature sensors and the temperature control element based on output values of the plurality of temperature sensors in a state where the temperature control element operates.

9 Claims, 12 Drawing Sheets

FIG. 6
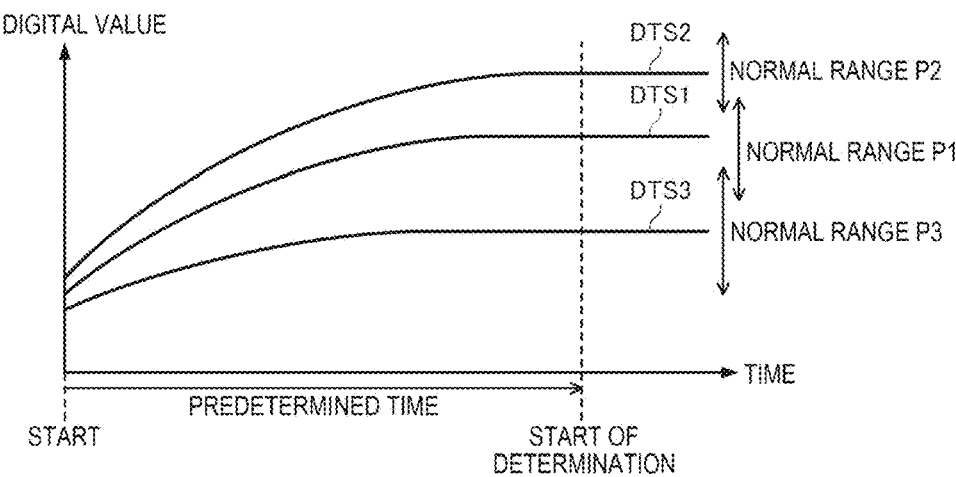
FIG. 7
FIG. 8
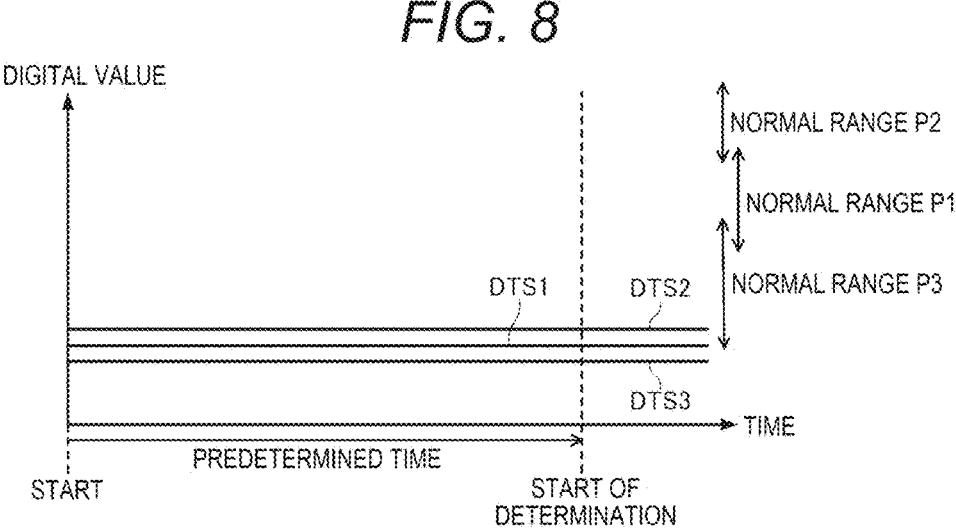

OSCILLATOR

The present application is based on, and claims priority from JP Application Serial Number 2023-222298, filed Dec. 28, 2023, the disclosure of which is hereby incorporated by reference herein in its entirety.

BACKGROUND

1. Technical Field

The present disclosure relates to an oscillator.

2. Related Art

JP-A-2023-121282 discloses an oscillator that prevents abnormal heat generation in a temperature control element by monitoring, with temperature sensors in two systems, whether abnormal heat is generated in the temperature control element and disabling an operation of a temperature control circuit when abnormal heat is generated in the temperature control element.

In the oscillator disclosed in JP-A-2023-121282, the abnormal heat generation in the temperature control element is prevented for the purpose of ensuring safety, but in a high-precision oscillator that obtains high frequency precision by performing temperature control or temperature compensation using a plurality of temperature sensors, the frequency precision may decrease when any one of the plurality of temperature sensors fails, and thus it is desirable to detect a failure of the plurality of temperature sensors.

SUMMARY

An aspect of an oscillator according to the disclosure includes:

a resonator element;

an oscillation circuit configured to cause the resonator element to oscillate;

a temperature control element configured to control a temperature of the resonator element;

a plurality of temperature sensors;

a failure detection circuit; and a container configured to accommodate the resonator element, the oscillation circuit, the temperature control element, the plurality of temperature sensors, and the failure detection circuit, in which the failure detection circuit performs failure detection for the plurality of temperature sensors and the temperature control element based on output values of the plurality of temperature sensors in a state where the temperature control element operates.

BRIEF DESCRIPTION OF THE DRAWINGS

FIG. 6 shows an example of a change over time in a temperature code in the first embodiment.

FIG. 7 shows another example of the change over time in the temperature code in the first embodiment.

FIG. 8 shows another example of the change over time in the temperature code in the first embodiment.

DESCRIPTION OF EMBODIMENTS

Hereinafter, preferred embodiments of the disclosure will be described in detail with reference to the drawings. The embodiments to be described below do not unduly limit contents of the disclosure described in the claims. Not all configurations described below are necessarily essential components of the disclosure.

1. First Embodiment 1-1. Configuration of Oscillator

Figure 1:
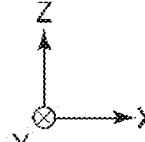
FIG. 1 is a cross-sectional view of an oscillator in an embodiment.
Figure 2:
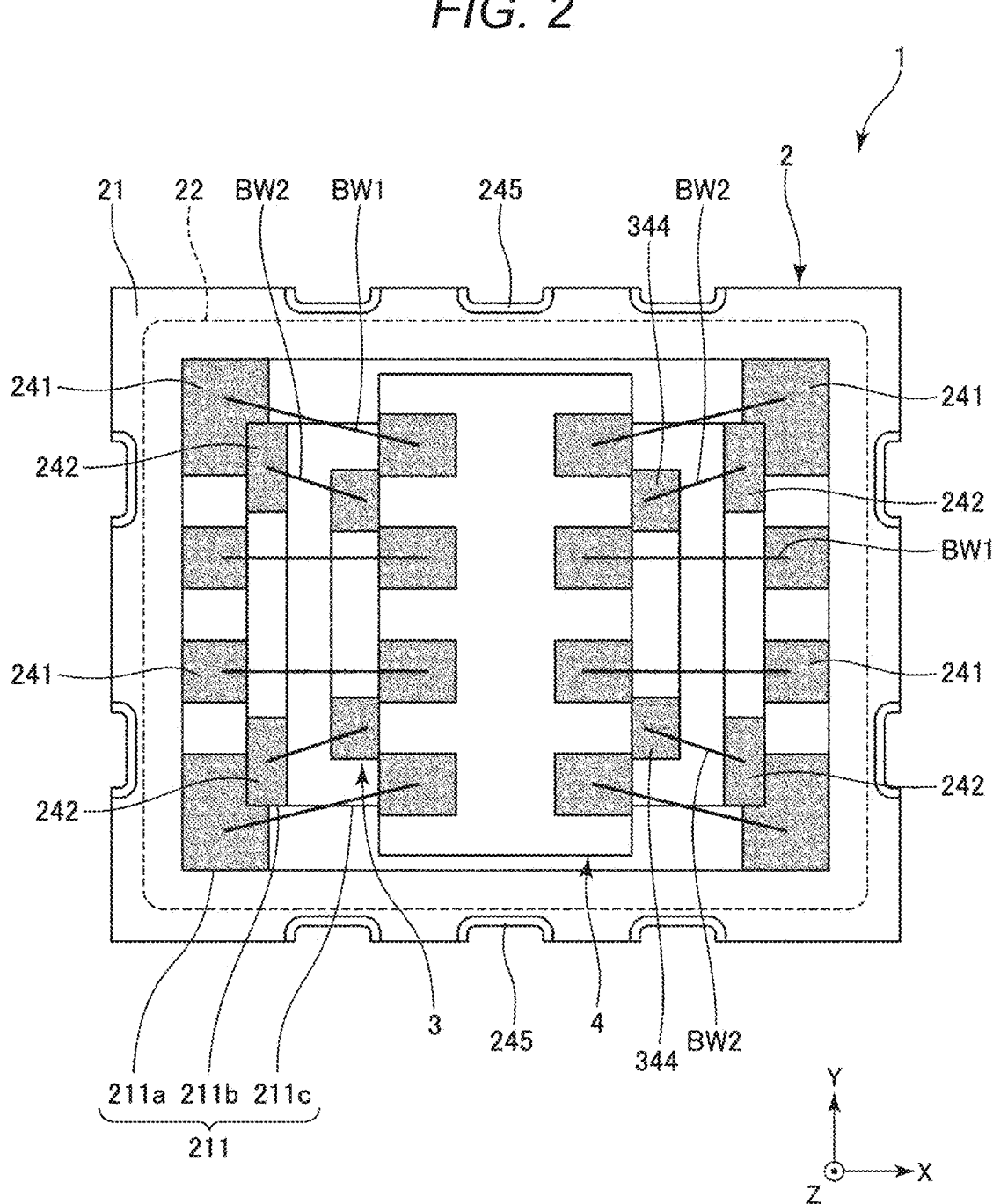
FIG. 2 is a plan view of the oscillator in the embodiment.
Figure 3:
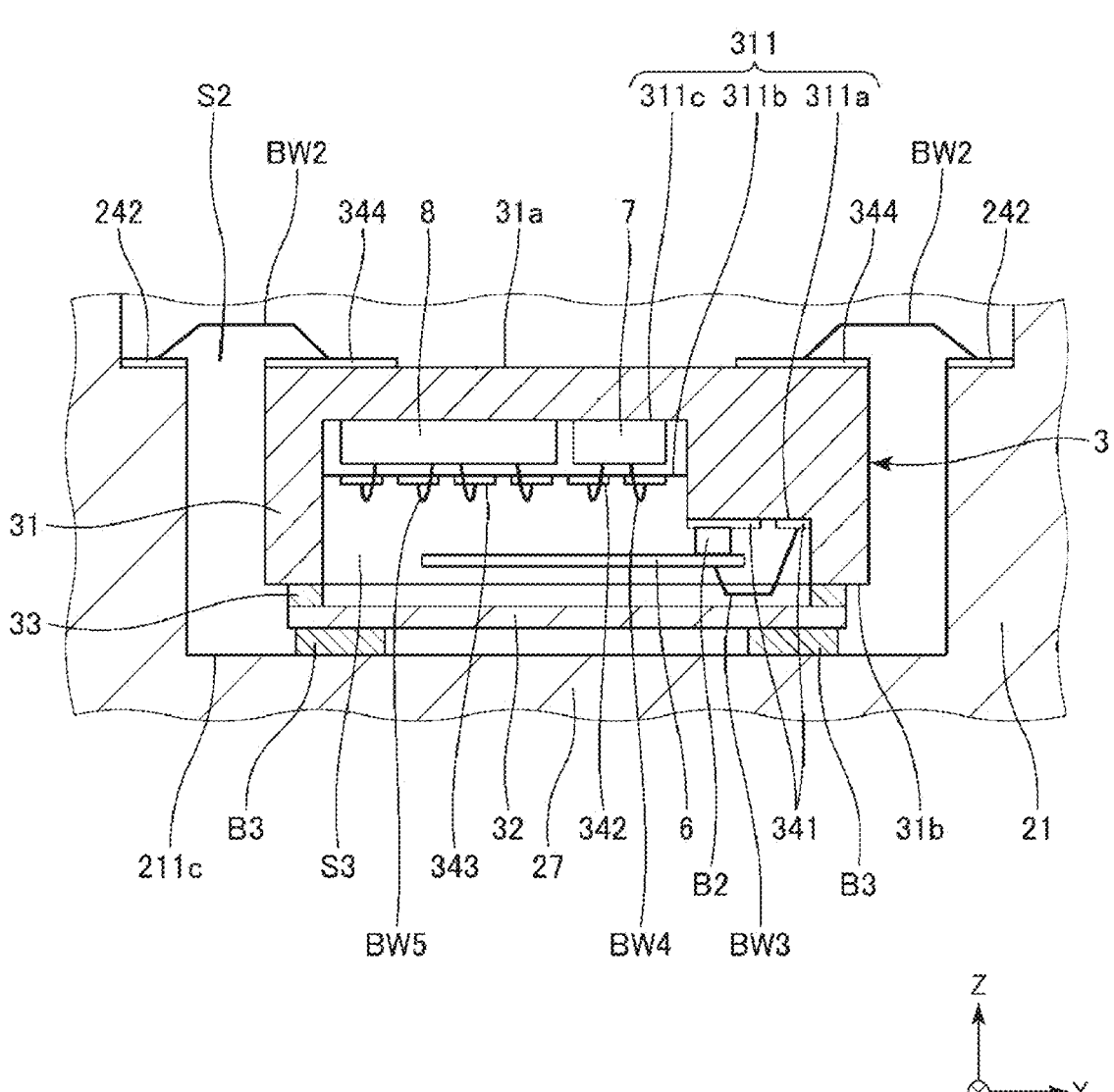
FIG. 3 is a cross-sectional view showing an inner package of the oscillator and the inside thereof.
Figure 4:
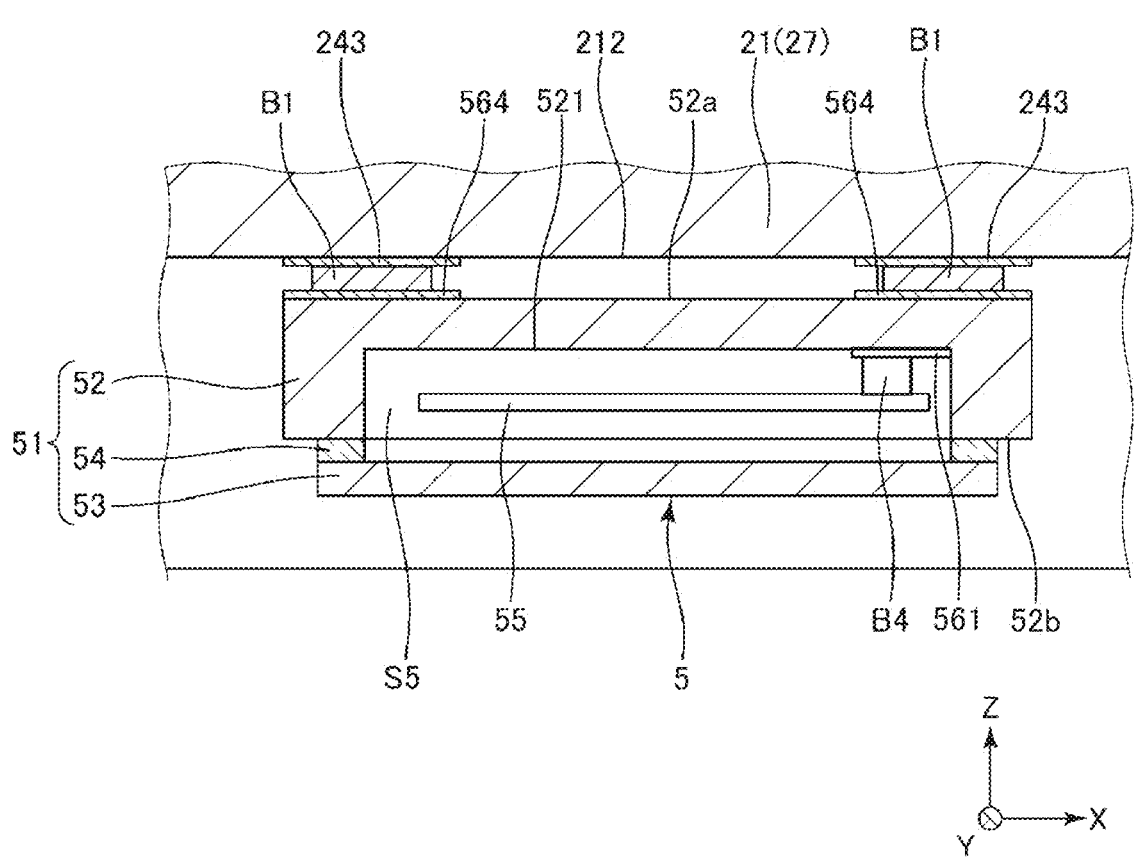
FIG. 4 is a cross-sectional view showing a resonator of the oscillator.

FIG. 1 is a cross-sectional view showing an oscillator in an embodiment. FIG. 2 is a plan view of the oscillator as viewed from above. FIG. 3 is a cross-sectional view showing an inner package of the oscillator and the inside thereof. FIG. 4 is a cross-sectional view showing a resonator of the oscillator.

An oscillator 1 shown in FIGS. 1 and 2 is an oven type quartz crystal oscillator, and includes an outer package 2, an inner package 3, a control IC 4, and a resonator 5. The inner package 3, the control IC 4, and the resonator 5 are accommodated in the outer package 2.

As shown in FIG. 1, the outer package 2 includes an outer base 21 and an outer lid 22. The outer base 21 includes a board 27, a frame-shaped wall portion 28 standing upward from an edge portion of an upper surface of the board 27, and a frame-shaped leg portion 29 standing downward from an edge portion of a lower surface of the board 27. The upper surface of the board 27 and the wall portion 28 form an upper recess 211 that opens in an upper surface 21a of the outer base 21, and the lower surface of the board 27 and the leg portion 29 form a lower recess 212 that opens in a lower surface 21b of the outer base 21. Therefore, the outer base 21 has a substantially H-shaped cross section.

The upper recess 211 includes a first upper recess 211a that opens in the upper surface 21a, a second upper recess 211b that opens in a bottom surface of the first upper recess 211a and has an opening smaller than that of the first upper recess 211a, and a third upper recess 211c that opens in a bottom surface of the second upper recess 211b and has an opening smaller than that of the second upper recess 211b. The control IC 4 is disposed at the bottom surface of the first upper recess 211a, and the inner package 3 is disposed at a bottom surface of the third upper recess 211c.

The outer lid 22 is bonded to the upper surface 21a of the outer base 21 via a sealing member 23 such as a seal ring or low-melting-point glass to close the opening of the upper recess 211. Accordingly, the upper recess 211 is hermetically sealed, and an outer accommodation space S2 serving as an accommodation space is formed in the outer package 2. Meanwhile, the opening of the lower recess 212 is not sealed and faces the outside of the outer package 2. The inner package 3 and the control IC 4 are accommodated in the outer accommodation space S2, and the resonator 5 is disposed at the lower recess 212.

The outer base 21 includes a plurality of internal terminals 241 disposed at the bottom surface of the first upper recess 211a, a plurality of internal terminals 242 disposed at the bottom surface of the second upper recess 211b, a plurality of internal terminals 243 disposed at a bottom surface of the lower recess 212, and a plurality of external terminals 244 disposed at the lower surface 21b, that is, a top surface of the leg portion 29. Each internal terminal 241 is electrically coupled to the control IC 4 via a bonding wire BW1, each internal terminal 242 is electrically coupled to the inner package 3 via a bonding wire BW2, and each internal terminal 243 is electrically coupled to the resonator 5 via a conductive bonding member B1.

The respective terminals 241, 242, 243, and 244 are electrically connected as appropriate through internal wiring 25 formed in the outer base 21 to electrically connect the control IC 4, the inner package 3, the resonator 5, and the external terminal 244. The internal wiring 25 is coupled to the external terminal 244 through the inside of the leg portion 29. The external terminal 244 is coupled to an external apparatus (not shown). A side surface terminal 245 coupled to the external terminal 244 is disposed at a side surface of the leg portion 29. The side surface terminal 245 is a castellation. Therefore, solder H spreads over the side surface terminal 245 to form a fillet, and thus mechanical and electrical connection with the external apparatus becomes stronger. However, the configuration is not limited thereto, and for example, the side surface terminal 245 may be omitted.

As shown in FIG. 3, the inner package 3 includes an inner base 31 and an inner lid 32. The inner base 31 has a recess 311 that opens in a lower surface 31b.

The recess 311 includes a first recess 311a that opens in the lower surface 31b, a second recess 311b that opens in a bottom surface of the first recess 311a and has an opening smaller than that of the first recess 311a, and a third recess 311c that opens in a bottom surface of the second recess 311b and has an opening smaller than that of the second recess 311b. A resonator element 6 is disposed at the bottom surface of the first recess 311a, and a heat generation IC 7 and an oscillation IC 8 are disposed side by side in an X-axis direction at a bottom surface of the third recess 311c.

The inner lid 32 is bonded to the lower surface 31b of the inner base 31 via a sealing member 33 such as a seal ring or low-melting-point glass to close the opening of the recess 311. Accordingly, the recess 311 is hermetically sealed, and an inner accommodation space S3 is formed in the inner package 3. The resonator element 6, the heat generation IC 7, and the oscillation IC 8 are accommodated in the inner accommodation space S3.

Such an inner accommodation space S3 is airtight and in a reduced pressure state, and is preferably in a state closer to vacuum. Accordingly, viscous resistance in the inner accommodation space S3 is reduced, and a vibrational characteristic of the resonator element 6 is improved. However, an atmosphere in the inner accommodation space S3 is not particularly limited.

The inner base 31 includes a plurality of internal terminals 341 disposed at the bottom surface of the first recess 311a, a plurality of internal terminals 342 and 343 disposed at the bottom surface of the second recess 311b, and a plurality of external terminals 344 disposed at an upper surface 31a of the inner base 31. Each internal terminal 341 is electrically coupled to the resonator element 6 via a conductive bonding member B2 and a bonding wire BW3, each internal terminal 342 is electrically coupled to the heat generation IC 7 via a bonding wire BW4, and each internal terminal 343 is electrically coupled to the oscillation IC 8 via a bonding wire BW5.

The terminals 341, 342, 343, and 344 are electrically connected as appropriate through internal wiring (not shown) formed in the inner package 3 to electrically connect the resonator element 6, the heat generation IC 7, the oscillation IC 8, and the external terminal 344. The inside and the outside of such an inner package 3 are electrically connected via the external terminal 344.

The inner package 3 as described above is fixed to the bottom surface of the third upper recess 211c via a bonding member B3 having sufficiently low thermal conductivity at the inner lid 32.

As shown in FIG. 3, the heat generation IC 7 is disposed at the bottom surface of the third recess 311c with an active surface facing downward (toward the inner lid 32) and is electrically coupled to the plurality of internal terminals 342 via the bonding wire BW4. The oscillation IC 8 is disposed at the bottom surface of the third recess 311c with an active surface facing downward (toward the inner lid 32) and is electrically coupled to the plurality of internal terminals 343 via the bonding wire BW5.

As shown in FIG. 4, the resonator 5 includes a package 51 and a resonator element 55 accommodated in the package 51.

The package 51 includes a base 52 and a lid 53. The base 52 has a recess 521 that opens in a lower surface 52b. The resonator element 55 is disposed at a bottom surface of the recess 521.

The lid 53 is bonded to the lower surface 52b of the base 52 via a sealing member 54 such as a seal ring or low-melting-point glass to close the opening of the recess 521. Accordingly, the recess 521 is hermetically sealed, and an accommodation space S5 is formed in the package 51. The resonator element 55 is accommodated in the accommodation space S5. The accommodation space S5 is airtight and in a depressurized state, and is preferably in a state closer to vacuum. Accordingly, viscous resistance in the accommodation space S5 is reduced, and a vibrational characteristic of the resonator element 55 is improved. However, an atmosphere in the accommodation space S5 is not particularly limited.

The base 52 includes a plurality of internal terminals 561 disposed at the bottom surface of the recess 521 and a plurality of external terminals 564 disposed at an upper surface 52a of the base 52. Each internal terminal 561 is electrically coupled to the resonator element 55 via a conductive bonding member B4. The terminals 561 and 564 are electrically connected as appropriate through internal wiring (not shown) formed in the base 52 to electrically connect the resonator element 55 and the external terminal 564. The inside and the outside of such a package 51 are electrically connected via the external terminal 564.

The resonator element 55 is an AT cut quartz crystal resonator element. Alternatively, the resonator element 55 may not be the AT cut quartz crystal resonator element, and may be, for example, an SC cut quartz crystal resonator element, a BT cut quartz crystal resonator element, a tuning fork type quartz crystal resonator element, a surface acoustic wave resonator, another piezoelectric resonator element, or a MEMS resonator element.

As shown in FIG. 4, the resonator 5 is fixed to the bottom surface of the lower recess 212 via the conductive bonding member B1. The external terminal 564 and the internal terminal 243 are electrically connected via the bonding member B1.

1-2. Functional Configuration of Oscillator

Figure 5:
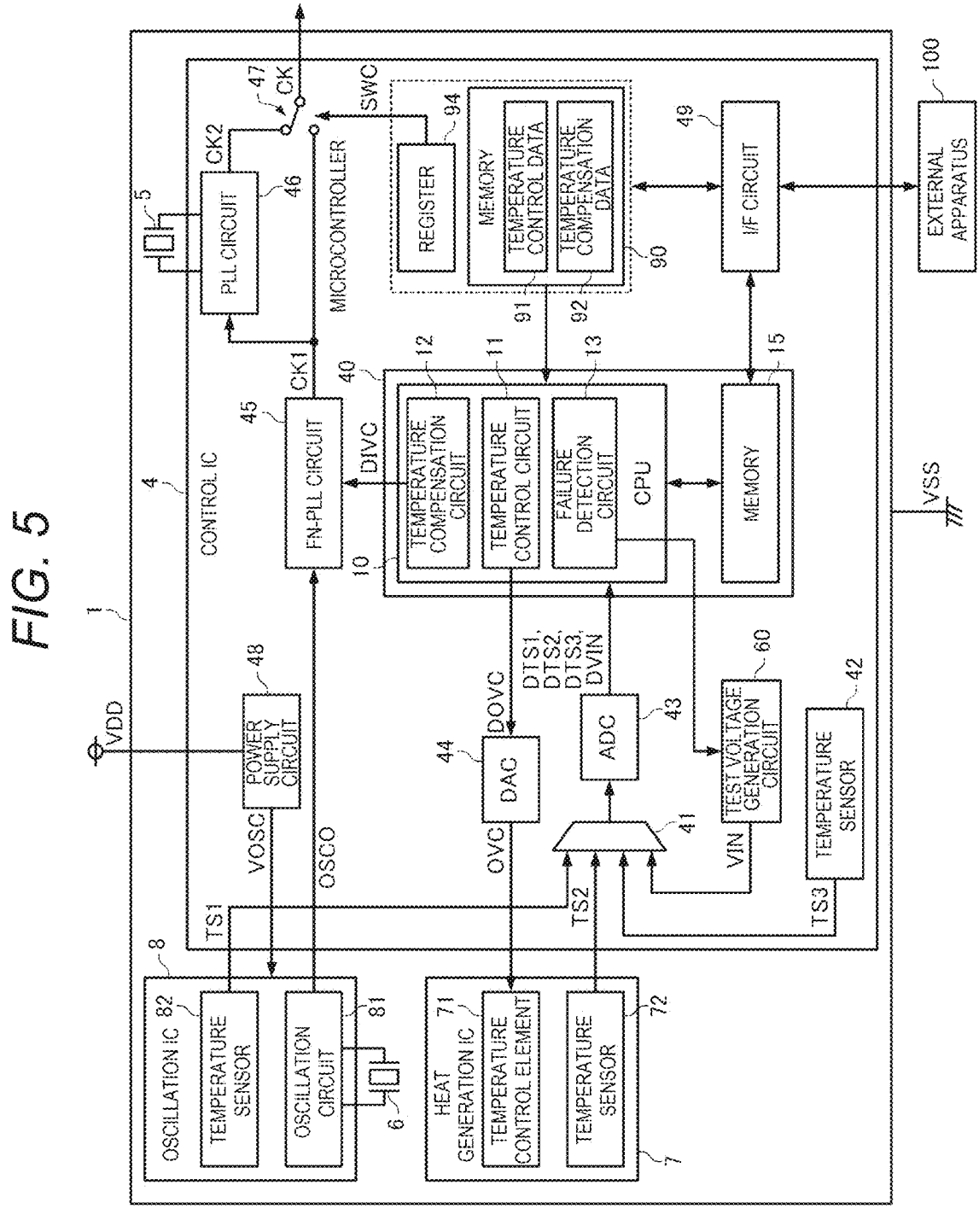
FIG. 5 is a functional block diagram of an oscillator in a first embodiment.

FIG. 5 is a functional block diagram of the oscillator 1 in a first embodiment. In FIG. 5, the same components as those in FIGS. 1 to 4 are denoted by the same reference signs. As shown in FIG. 5, the oscillator 1 in the first embodiment includes the control IC 4, the resonator 5, the resonator element 6, the heat generation IC 7, and the oscillation IC 8.

The oscillation IC 8 includes an oscillation circuit 81 and a temperature sensor 82, and operates by being supplied with a power supply voltage VOSC from the control IC 4. The oscillation circuit 81 is electrically coupled to both ends of the resonator element 6, amplifies an output signal of the resonator element 6 and feeds back the amplified output signal to the resonator element 6, thereby causing the resonator element 6 to oscillate and outputting an oscillation signal OSCO. For example, the oscillation circuit 81 may be an oscillation circuit using an inverter as an amplification element or may be an oscillation circuit using a bipolar transistor as the amplification element. The oscillation signal OSCO output from the oscillation circuit 81 is received by the control IC 4.

The temperature sensor 82 is a temperature sensing element that detects a temperature and outputs a temperature detection signal TS1 having a voltage level corresponding to the detected temperature. The temperature sensor 82 is built in the oscillation IC 8 to detect a temperature of the oscillation IC 8. Since the oscillation circuit 81 is also built in the oscillation IC 8, the temperature sensor 82 detects a temperature of the oscillation circuit 81. The temperature detection signal TS1 output from the temperature sensor 82 is received by the control IC 4. The temperature sensor 82 may be, for example, a sensor utilizing temperature dependence of a forward voltage of a PN junction of a diode.

The heat generation IC 7 includes a temperature control element 71 and a temperature sensor 72. The temperature control element 71 is an element that controls a temperature of the resonator element 6 based on a temperature control signal OVC output from the control IC 4, and may be a heat generation element. For example, the temperature control element 71 is a CMOS transistor, and an amount of generated heat changes according to a voltage of the temperature control signal OVC received by a gate. As the amount of heat generated by the temperature control element 71 increases, the temperature of the resonator element 6 increases, and the amount of heat generated by the temperature control element 71 is controlled by the control IC 4 such that the temperature of the resonator element 6 is constant at a target set temperature. For example, the set temperature may be a fixed value such as 80° C., or may be set as desired within a predetermined range such as a range of 70° C. or higher and 125° C. or lower.

The temperature sensor 72 is a temperature sensing element that detects a temperature and outputs a temperature detection signal TS2 having a voltage level corresponding to the detected temperature. The temperature sensor 72 is built in the heat generation IC 7 to detect a temperature of the heat generation IC 7. Since the temperature control element 71 is also built in the heat generation IC 7, the temperature sensor 72 detects a temperature of the temperature control element 71. The temperature detection signal TS2 output from the temperature sensor 72 is received by the control IC 4. The temperature sensor 72 may be, for example, a sensor utilizing temperature dependence of a forward voltage of a PN junction of a diode.

As shown in FIG. 3, the resonator element 6, the heat generation IC 7, and the oscillation IC 8 are accommodated in the inner package 3, and heat generation of the heat generation IC 7 is controlled by the control IC 4 such that the temperature of the resonator element 6 is constant. The heat generation IC 7 is a heat source, radiant heat from the heat generation IC 7 is transmitted to the resonator element 6 and the oscillation IC 8, and thus a difference occurs between the temperature of the resonator element 6 and the oscillation IC 8 and the temperature of the heat generation IC 7. Meanwhile, the resonator element 6 and the oscillation IC 8 are disposed apart from the heat generation IC 7, and assuming that a thermal distance between the heat generation IC 7 and the resonator element 6 is substantially the same as a thermal distance between the heat generation IC 7 and the oscillation IC 8, it can be said that the temperature of the oscillation IC 8 is close to the temperature of the resonator element 6. That is, the temperature detected by the temperature sensor 82 built in the oscillation IC 8 is closer to the temperature of the resonator element 6 than the temperature detected by the temperature sensor 72 built in the heat generation IC 7. Therefore, as will be described later, the control IC 4 controls heat generation of the heat generation IC 7 based on the temperature detection signal TS1 output from the temperature sensor 82. However, depending on an arrangement of the resonator element 6, the heat generation IC 7, and the oscillation IC 8, the temperature of the heat generation IC 7 may be closer to the temperature of the resonator element 6 than the temperature of the oscillation IC 8, and in this case, the control IC 4 may control the heat generation of the heat generation IC 7 based on the temperature detection signal TS2 output from the temperature sensor 72.

The control IC 4 includes a microcontroller 40, a selector 41, a temperature sensor 42, an A/D conversion circuit 43, a D/A conversion circuit 44, a fractional-N PLL circuit 45, a PLL circuit 46, a switch circuit 47, a power supply circuit 48, an interface circuit 49, a memory 90, and a register 94. The PLL is an abbreviation for phase locked loop.

The power supply circuit 48 generates, based on a power supply voltage VDD supplied from the outside of the oscillator 1 and a ground voltage VSS, the power supply voltage VOSC that is a constant voltage lower than the power supply voltage VDD. For example, the power supply circuit 48 generates the power supply voltage VOSC that is a constant voltage based on an output voltage of a bandgap reference circuit. The power supply voltage VOSC is supplied to the oscillation IC 8.

The fractional-N PLL circuit 45 receives the oscillation signal OSCO output from the oscillation IC 8, and generates and outputs a clock signal CK1 obtained by converting a frequency $f_{OSCO}$ of the oscillation signal OSCO into a frequency $f_{CK1}$ corresponding to a division ratio indicated by a division ratio control signal DIVC. The fractional-N PLL circuit 45 generates the clock signal CK1 by performing feedback control such that a phase of the oscillation signal OSCO matches a phase of a signal obtained by dividing the clock signal CK1 using a division ratio specified by the division ratio control signal DIVC. The division ratio control signal DIVC is delta-sigma modulated, the division ratio specified by the division ratio control signal DIVC is switched among a plurality of integer division ratios, and becomes a fractional division ratio when being averaged. Therefore, the frequency $f_{CK1}$ is a non-integer multiple of the frequency $f_{OSCO}$. The fractional-N PLL circuit 45 may output, according to the division ratio control signal DIVC, the clock signal CK1 having the frequency $f_{CK1}$ that is different from the frequency $f_{OSCO}$ and is substantially constant regardless of an outside air temperature.

The PLL circuit 46 receives the clock signal CK1 output from the fractional-N PLL circuit 45, and generates and outputs a clock signal CK2 having a frequency $f_{CK2}$ that is the same frequency as the frequency $f_{CK1}$ of the clock signal CK1. The PLL circuit 46 generates the clock signal CK2 by performing feedback control on an oscillation frequency of the resonator 5 such that a phase of the clock signal CK1 matches a phase of the clock signal CK2 based on a signal output from the resonator 5.

The frequency $f_{CK1}$ of the clock signal CK1 output from the fractional-N PLL circuit 45 is a non-integer multiple of the frequency $f_{OSCO}$ of the oscillation signal OSCO and has large jitter. In contrast, the frequency $f_{CK2}$ of the clock signal CK2 output from the PLL circuit 46 is the same as the frequency $f_{CK1}$ of the clock signal CK1, and has smaller jitter than that of the clock signal CK1 since the clock signal CK2 is generated by oscillation of the resonator 5 having high frequency stability.

The switch circuit 47 outputs a clock signal CK obtained by selecting the clock signal CK1 or the clock signal CK2 according to a logic level of a switch control signal SWC output from the register 94. The clock signal CK is output to the outside of the oscillator 1. The clock signal CK may be supplied to an external apparatus 100 or may be supplied to an apparatus different from the external apparatus 100. For example, the clock signal CK2 with small jitter may be selected as the clock signal CK during a normal operation of the oscillator 1, and the clock signal CK1 may be selected as the clock signal CK during a test of the clock signal CK1.

The temperature sensor 42 is a temperature sensing element that detects a temperature and outputs a temperature detection signal TS3 having a voltage level corresponding to the detected temperature. The temperature sensor 42 is built in the control IC 4 to detect a temperature of the control IC 4. As shown in FIG. 1, the control IC 4 is disposed at a place close to the outer lid 22, a distance between the resonator element 6 and the temperature sensor 42 is larger than a distance between the resonator element 6 and the temperature sensor 82 provided in the oscillation IC 8, and the temperature of the control IC 4 is easily affected by a temperature of outside air of the oscillator 1. Therefore, when an amount of heat generated by the control IC 4 is substantially constant, the temperature sensor 42 can detect a change in the temperature of the outside air of the oscillator 1. The temperature detection signal TS3 output from the temperature sensor 42 is received by the control IC 4. The temperature sensor 42 may be, for example, a sensor utilizing temperature dependence of a forward voltage of a PN junction of a diode.

The selector 41 selects and outputs any one of the temperature detection signal TS1 output from the oscillation IC 8, the temperature detection signal TS2 output from the heat generation IC 7, the temperature detection signal TS3 output from the temperature sensor 42, and a test voltage VIN output from a test voltage generation circuit 60. In the embodiment, the selector 41 selects the temperature detection signals TS1, TS2, and TS3 in a time-division manner and periodically outputs the selected signals. As will be described later, when a self test of the A/D conversion circuit 43 is performed, the selector 41 selects and outputs the test voltage VIN.

The A/D conversion circuit 43 converts voltages of the temperature detection signals TS1, TS2, and TS3, and the test voltage VIN, which are analog signals output from the selector 41 in a time-division manner, into temperature codes DTS1, DTS2, DTS3, and a test code DVIN, which are digital signals, respectively. The A/D conversion circuit 43 may convert the temperature detection signals TS1, TS2, TS3, and the test voltage VIN into the temperature codes DTS1, DTS2, DTS3, and the test code DVIN after converting voltage levels using a resistor divider or the like.

The microcontroller 40 includes a CPU 10 and a memory 15. The CPU is an abbreviation for a central processing unit. Temperature control data 91 and temperature compensation data 92 are stored in the non-volatile memory 90 and are transferred to the memory 15 when the oscillator 1 is started up. A temperature control program, a temperature compensation program, and a failure detection program (not shown) are stored in the non-volatile memory 90 and are transferred to the memory 15 when the oscillator 1 is started up.

The CPU 10 functions as a temperature control circuit 11 by executing the temperature control program transferred to the memory 15. The temperature control circuit 11 controls an operation of the temperature control element 71 built in the heat generation IC 7. Specifically, the temperature control circuit 11 outputs, based on the temperature code DTS1 and the temperature control data 91 transferred to the memory 15 and stored therein, a temperature control code DOVC for controlling the amount of heat generated by the temperature control element 71. For example, the temperature control data 91 may include information on the target set temperature for the temperature of the resonator element 6 and gain information for controlling the amount of heat generated by the temperature control element 71. Alternatively, when the target set temperature for the temperature of the resonator element 6 varies depending on the outside air temperature, the temperature control data 91 may include information indicating a relationship between the temperature code DTS3 and the set temperature. In this case, the temperature control circuit 11 outputs the temperature control code DOVC based on the temperature codes DTS1, DTS3, and the temperature control data 91.

The CPU 10 functions as a temperature compensation circuit 12 by executing the temperature compensation program transferred to the memory 15. The temperature compensation circuit 12 performs temperature compensation for the frequency of the oscillation signal OSCO generated when the oscillation circuit 81 built in the oscillation IC 8 causes the resonator element 6 to oscillate. Specifically, the temperature compensation circuit 12 outputs, based on the temperature code DTS3 and the temperature compensation data 92 transferred to the memory 15, the division ratio control signal DIVC for causing the fractional-N PLL circuit 45 to output the clock signal CK1 whose frequency is constant regardless of the temperature. For example, the temperature compensation data 92 may be table information indicating a relationship between the temperature code DTS3 and the frequency of the oscillation signal OSCO, or may be information on a coefficient value for each order in a mathematical formula indicating the relationship. Alternatively, the temperature compensation data 92 may be information indicating a relationship between the temperature code DTS3 and a value of a fractional division ratio of the fractional-N PLL circuit 45 calculated based on the relationship between the temperature code DTS3 and the frequency of the oscillation signal OSCO.

The CPU 10 functions as a failure detection circuit 13 by executing the failure detection program transferred to the memory 15. The failure detection circuit 13 performs failure detection for the plurality of temperature sensors 82, 72, 42, and the temperature control element 71 based on output values from the plurality of temperature sensors 82, 72, and 42 in a state where the temperature control element 71 operates. The failure detection circuit 13 performs the self test of the A/D conversion circuit 43 according to a result of the failure detection, if necessary. When performing the self test of the A/D conversion circuit 43, the failure detection circuit 13 causes the test voltage generation circuit 60 to output the test voltage VIN. The test voltage VIN is a predetermined voltage, and may be, for example, a voltage equal to a reference voltage of the A/D conversion circuit 43. The failure detection circuit 13 performs failure detection for the A/D conversion circuit 43 based on the test code DVIN obtained by converting the test voltage VIN with the A/D conversion circuit 43. Details of processing of the failure detection circuit 13 will be described later.

The D/A conversion circuit 44 converts the temperature control code DOVC, which is a digital signal output from the temperature control circuit 11, into the temperature control signal OVC, which is an analog signal. The temperature control signal OVC is supplied to the temperature control element 71 of the heat generation IC 7.

The interface circuit 49 is a circuit for performing data communication with the external apparatus 100 coupled to the oscillator 1. Specifically, the interface circuit 49 writes or reads data to or from the memory 90, the register 94, or the memory 15 of the microcontroller 40 in response to a request from the external apparatus 100. The interface circuit 49 may be, for example, an interface circuit corresponding to an I²C bus or an interface circuit corresponding to an SPI bus. The I²C is an abbreviation for an inter-integrated circuit. The SPI is an abbreviation for a serial peripheral interface.

In an inspection step at the time of manufacturing the oscillator 1, an inspection apparatus that is the external apparatus 100 may set the switch control signal SWC for causing the switch circuit 47 to select the clock signal CK1 via the interface circuit 49 and inspect the clock signal CK1. The inspection apparatus that is the external apparatus 100 writes the temperature control data 91 and the temperature compensation data 92, and further writes the temperature control program and the temperature compensation program to the memory 90 via the interface circuit 49. The temperature control data 91 and the temperature compensation data 92 may be set in the register 94 by the external apparatus 100 when the oscillator 1 is started up.

1-3. Processing of Failure Detection Circuit

When the oscillator 1 starts up, the temperature control element 71 starts to operate, and an internal temperature of the oscillator 1 rises along with an elapse of time due to heat generated by the temperature control element 71. Since the internal temperature of the oscillator 1 rises as the temperature of the temperature control element 71 rises, the output values of the plurality of temperature sensors 82, 72, and 42 also rise. When the temperature of the temperature control element 71 stabilizes, the internal temperature of the oscillator 1 stabilizes, and the output values of the temperature sensors 82, 72, and 42 also stabilize. In the embodiment, the failure detection circuit 13 determines whether the output values of the temperature sensors 82, 72, and 42 are within a normal range and performs failure detection for the temperature sensors 82, 72, 42, and the temperature control element 71 based on a determination result. The normal range of each output value of the temperature sensors 82, 72, and 42 may be, for example, a range between an upper limit and a lower limit of each output value of the temperature sensors 82, 72, and 42 expected when the outside air temperature changes in a temperature range in which the operation of the oscillator 1 determined by a specification is guaranteed.

As described above, the A/D conversion circuit 43 performs A/D conversion on each of the output values of the plurality of temperature sensors 82, 72, and 42 to generate the temperature codes DTS1, DTS2, and DTS3, which are a plurality of pieces of temperature data. Therefore, as the temperature of the temperature control element 71 rises, values of the temperature codes DTS1, DTS2, and DTS3 rise, and when the temperature of the temperature control element 71 stabilizes, the values of the temperature codes DTS1, DTS2, and DTS3 also stabilize.

After the values of the temperature codes DTS1, DTS2, and DTS3 stabilize, the value of the temperature code DTS1 is within a normal range P1 if the temperature sensor 82 is normal, the value of the temperature code DTS2 is within a normal range P2 if the temperature sensor 72 is normal, and the value of the temperature code DTS3 is within a normal range P3 if the temperature sensor 42 is normal. Therefore, the failure detection circuit 13 can determine whether each of the temperature sensors 82, 72, and 42 is normal or fails by determining whether each value of the temperature codes DTS1, DTS2, and DTS3 is within each of the normal ranges P1, P2, and P3, respectively, after a predetermined time longer than an expected time for the output values of the temperature sensors 82, 72, and 42 to stabilize elapses from when the temperature control element 71 starts to operate. After starting the determination, the failure detection circuit 13 may repeat the determination in a cycle in which the temperature codes DTS1, DTS2, and DTS3 are updated, or may repeat the determination in a predetermined cycle.

For example, as shown in FIG. 6, when the temperature codes DTS1, DTS2, and DTS3 are within the normal ranges P1, P2, and P3, respectively, the failure detection circuit 13 determines that the temperature sensors 82, 72, and 42 are all normal.

As shown in FIG. 7, when the temperature codes DTS2 and DTS3 are within the normal ranges P2 and P3, respectively, and the temperature code DTS1 is out of the normal range P1, the failure detection circuit 13 determines that the temperature sensors 72 and 42 are normal and the temperature sensor 82 fails. Generally speaking, when a value of a temperature code corresponding to an output value of at least one temperature sensor among the plurality of temperature sensors 82, 72, and 42 is normal and a value of a temperature code corresponding to an output value of another temperature sensor is abnormal, the failure detection circuit 13 determines that the other temperature sensor fails.

As shown in FIG. 8, when the temperature codes DTS1, DTS2, and DTS3 are out of the normal ranges P1, P2, and P3, respectively, it is unlikely that the temperature sensors 82, 72, and 42 fail simultaneously, and there is a high possibility that the temperature control element 71 or the A/D conversion circuit 43 fails. Therefore, when the plurality of temperature codes DTS1, DTS2, and DTS3 are all out of the normal ranges, the failure detection circuit 13 determines that the temperature control element 71 or the A/D conversion circuit 43 fails. Specifically, when the temperature codes DTS1, DTS2, and DTS3 are all out of the normal ranges P1, P2, and P3, the failure detection circuit 13 performs the self test of the A/D conversion circuit 43 and determines which of the temperature control element 71 and the A/D conversion circuit 43 fails based on a result of the self test. That is, the failure detection circuit 13 causes the test voltage generation circuit 60 to output the test voltage VIN, determines that the temperature control element 71 fails if the test code DVIN obtained by converting the test voltage VIN with the A/D conversion circuit 43 is within a normal range, and determines that the A/D conversion circuit 43 fails if the test code DVIN is out of the normal range.

Figure 9:
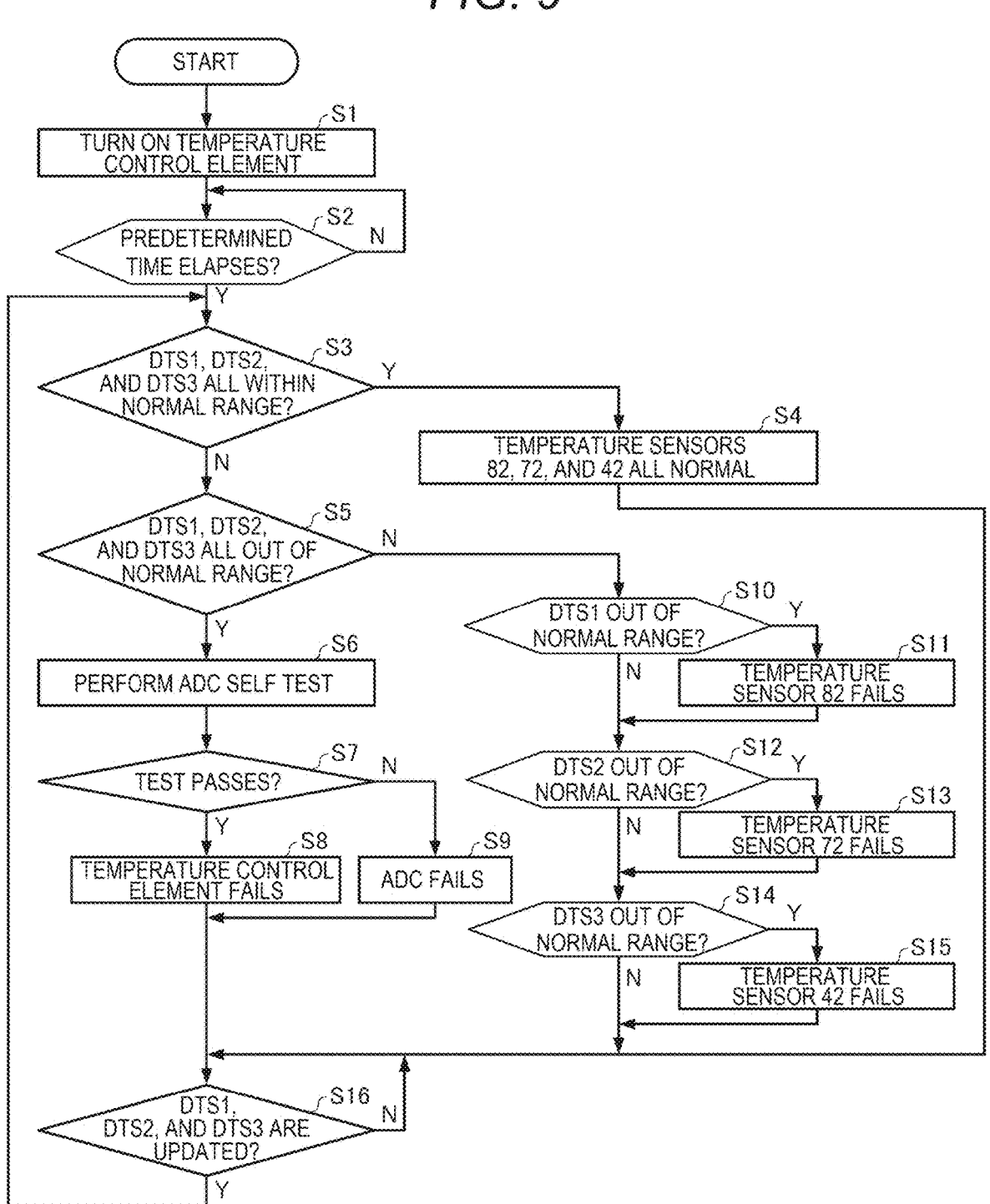
FIG. 9 shows an example of a processing procedure of a failure detection circuit in the first embodiment.

FIG. 9 shows an example of a processing procedure of the failure detection circuit 13 in the first embodiment. As shown in FIG. 9, when the temperature control element 71 is turned on to start an operation in step S1, in step S2, the failure detection circuit 13 stands by until a predetermined time elapses. The predetermined time is set to be longer than the expected time for the output values of the temperature sensors 82, 72, and 42 to stabilize after the temperature control element 71 starts to operate.

When the predetermined time elapses in step S2, in step S3, the failure detection circuit 13 determines whether the temperature codes DTS1, DTS2, and DTS3 are all within the normal range. If the temperature codes DTS1, DTS2, and DTS3 are all within the normal range in step S3, in step S4, the failure detection circuit 13 determines that the temperature sensors 82, 72, and 42 are all normal.

On the other hand, if at least one of the temperature codes DTS1, DTS2, and DTS3 is out of the normal range in step S3, in step S5, the failure detection circuit 13 determines whether the temperature codes DTS1, DTS2, and DTS3 are all out of the normal range.

If at least one of the temperature codes DTS1, DTS2, and DTS3 is within the normal range in step S5, when the temperature code DTS1 is out of the normal range in step S10, in step S11, the failure detection circuit 13 determines that the temperature sensor 82 fails. When the temperature code DTS2 is out of the normal range in step S12, in step S13, the failure detection circuit 13 determines that the temperature sensor 72 fails. If the temperature code DTS2 is within the normal range, when the temperature code DTS3 is out of the normal range in step S14, in step S15, the failure detection circuit 13 determines that the temperature sensor 42 fails. The failure detection circuit 13 determines that a temperature sensor that is not determined to fail among the temperature sensors 82, 72, and 42 is normal.

On the other hand, if the temperature codes DTS1, DTS2, and DTS3 are all out of the normal range in step S5, in step S6, the failure detection circuit 13 performs the self test of the A/D conversion circuit 43.

When the self test passes in step S7, in step S8, the failure detection circuit 13 determines that the temperature control element 71 fails. On the other hand, when the self test does not pass in step S7, in step S9, the failure detection circuit 13 determines that the A/D conversion circuit 43 fails.

In step S16, each time the temperature codes DTS1, DTS2, and DTS3 are updated, the failure detection circuit 13 repeats the processing after step S3.

The outer package 2 is an example of a "container". The temperature sensor 82 is an example of a "first temperature sensor". The temperature sensor 72 is an example of a "second temperature sensor". The temperature sensor 42 is an example of a "third temperature sensor".

1-4. Operation and Effect

As described above, according to the oscillator 1 in the first embodiment, in a state where the temperature control element 71 operates in the control IC 4, a difference occurs among the output values of the temperature sensors 82, 72, and 42 due to a positional relationship between the temperature control element 71 and the temperature sensors 82, 72, and 42, and the failure detection circuit 13 can detect the failure of the temperature sensors 82, 72, 42, and the temperature control element 71 based on the output values of the temperature sensors 82, 72, and 42. In the oscillator 1 having the structure shown in FIGS. 1 to 4, in a state where the temperature control element 71 operates, a difference between the temperature detected by the temperature sensor 72 and the temperature of the temperature control element 71 is smallest, a difference between the temperature detected by the temperature sensor 82 and the temperature of the temperature control element 71 is second smallest, and a difference between the temperature detected by the temperature sensor 42 farthest from the temperature control element 71 and the temperature of the temperature control element 71 is largest among the temperature sensors 82, 72, and 42. Therefore, the failure detection circuit 13 can detect the failure of the temperature sensors 82, 72, and 42 based on the output values of the temperature sensors 82, 72, and 42. Specifically, if each of the temperature sensors 82, 72, and 42 is normal, in a state where the temperature control element 71 operates, since the temperature codes DTS1, DTS2, and DTS3 have values in different normal ranges, the failure detection circuit 13 can determine whether each of the temperature codes DTS1, DTS2, and DTS3 is in the normal range, and detect the failure of the temperature sensors 82, 72, and 42 based on a determination result.

According to the oscillator 1 in the first embodiment, since the possibility that all of the temperature sensors 82, 72, and 42 simultaneously fail is extremely small, when the temperature codes DTS1, DTS2, and DTS3 are all out of the normal range, the failure detection circuit 13 can determine that the temperature control element 71 or the A/D conversion circuit 43 fails. Specifically, when the temperature codes DTS1, DTS2, and DTS3 are all out of the normal range, the failure detection circuit 13 can perform the self test of the A/D conversion circuit 43, determine that the temperature control element 71 fails if the self test passes, and determine that the A/D conversion circuit 43 fails if the self test does not pass.

2. Second Embodiment

Hereinafter, in a second embodiment, the same reference signs are given to similar configurations as those in the first embodiment, similar description as that in the first embodiment will be omitted or simplified, and contents different from those in the first embodiment will be mainly described.

Since a structure of the oscillator 1 in the second embodiment is the same as that in FIGS. 1 to 4, illustration and description thereof are omitted. A functional block diagram of the oscillator 1 in the second embodiment is the same as that in FIG. 5, and thus illustration and description thereof are omitted. However, in the second embodiment, processing of the failure detection circuit 13 is different from that in the first embodiment.

When the oscillator 1 starts up, the temperature control element 71 starts to operate, and the internal temperature of the oscillator 1 rises along with an elapse of time due to the heat generated by the temperature control element 71. Since the internal temperature of the oscillator 1 rises as the temperature of the temperature control element 71 rises, the output values of the plurality of temperature sensors 82, 72, and 42 also rise. When the temperature of the temperature control element 71 stabilizes, the internal temperature of the oscillator 1 stabilizes, and the output values of the temperature sensors 82, 72, and 42 also stabilize. In the embodiment, the failure detection circuit 13 performs the failure detection of the temperature sensors 82, 72, 42, and the temperature control element 71 based on an amount of change in the output values of the plurality of temperature sensors 82, 72, and 42 in a predetermined period within a period from when the temperature control element 71 starts to operate to when the temperature of the temperature control element 71 stabilizes.

For example, the failure detection circuit 13 may determine whether the amount of change in each output value of the temperature sensors 82, 72, and 42 in the predetermined period is within a normal range, and may perform the failure detection of the temperature sensors 82, 72, 42, and the temperature control element 71 based on a determination result. The normal range of the amount of change in each output value of the temperature sensors 82, 72, and 42 may be, for example, a range between an upper limit and a lower limit of the amount of change in each output value of the temperature sensors 82, 72, and 42 in a predetermined period expected when the outside air temperature changes in the temperature range in which the operation of the oscillator 1 determined by the specification is guaranteed.

As described above, the A/D conversion circuit 43 performs A/D conversion on each of the output values of the plurality of temperature sensors 82, 72, and 42 to generate the temperature codes DTS1, DTS2, and DTS3, which are a plurality of pieces of temperature data. Therefore, as the temperature of the temperature control element 71 rises, the values of the temperature codes DTS1, DTS2, and DTS3 rise, and when the temperature of the temperature control element 71 stabilizes, the values of the temperature codes DTS1, DTS2, and DTS3 also stabilize.

If the temperature sensor 82 is normal, an amount of change ΔDTS1 in the value of the temperature code DTS1 in a predetermined period within a period until the values of the temperature codes DTS1, DTS2, and DTS3 stabilize is within the normal range, if the temperature sensor 72 is normal, an amount of change ΔDTS2 in the value of the temperature code DTS2 in the predetermined period is within the normal range, and if the temperature sensor 42 is normal, an amount of change ΔDTS3 in the value of the temperature code DTS3 in the predetermined period is within the normal range. Therefore, the failure detection circuit 13 can determine whether each of the temperature sensors 82, 72, and 42 is normal or fails depending on whether each of the amounts of change ΔDTS1, ΔDTS2, and ΔDTS3 in the values of the temperature codes DTS1, DTS2, and DTS3 in the predetermined period is within the normal range.

Figure 10:
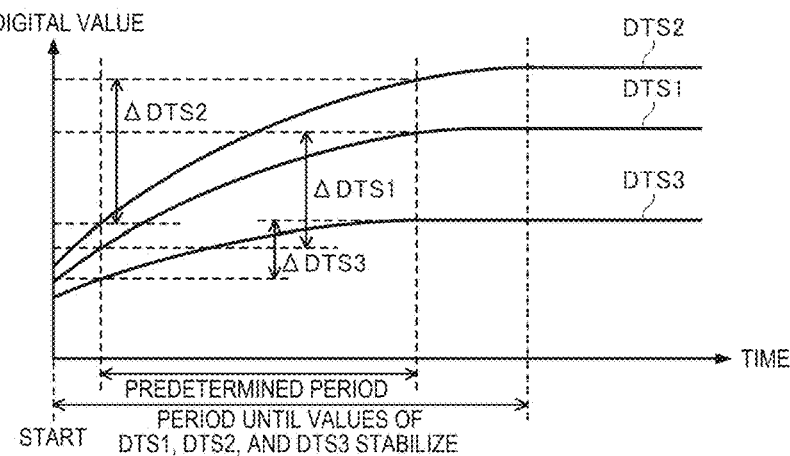
FIG. 10 shows an example of a change over time in a temperature code in a second embodiment.

For example, as shown in FIG. 10, when each of the amounts of change ΔDTS1, ΔDTS2, and ΔDTS3 is within the normal range, the failure detection circuit 13 determines that the temperature sensors 82, 72, and 42 are all normal.

Figure 11:
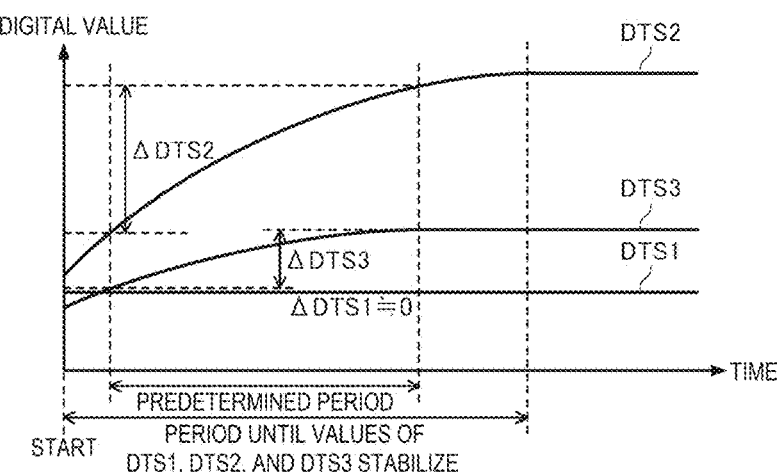
FIG. 11 shows another example of the change over time in the temperature code in the second embodiment.

As shown in FIG. 11, when the amounts of change ΔDTS2 and ΔDTS3 are each within the normal range and the amount of change ΔDTS1 is out of the normal range, the failure detection circuit 13 determines that the temperature sensors 72 and 42 are normal and the temperature sensor 82 fails. Generally speaking, when a value of a temperature code corresponding to an output value of at least one temperature sensor among the plurality of temperature sensors 82, 72, and 42 is normal and a value of a temperature code corresponding to an output value of another temperature sensor is abnormal, the failure detection circuit 13 determines that the other temperature sensor fails.

Figure 12:
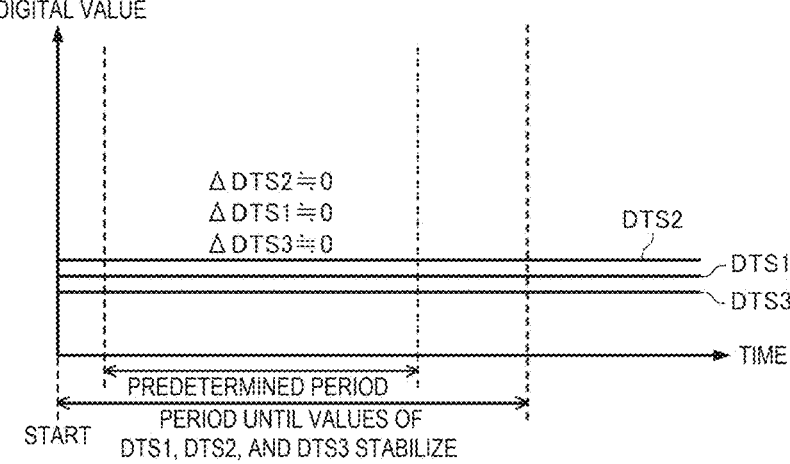
FIG. 12 shows another example of the change over time in the temperature code in the second embodiment.

As shown in FIG. 12, when each of the amounts of change ΔDTS1, ΔDTS2, and ΔDTS3 is out of the normal range, it is unlikely that the temperature sensors 82, 72, and 42 fail simultaneously, and there is a high possibility that the temperature control element 71 or the A/D conversion circuit 43 fails. Therefore, when each of the amounts of change ΔDTS1, ΔDTS2, and ΔDTS3 is out of the normal range, the failure detection circuit 13 determines that the temperature control element 71 or the A/D conversion circuit 43 fails. Specifically, when each of the amounts of change ΔDTS1, ΔDTS2, and ΔDTS3 is out of the normal range, the failure detection circuit 13 performs the self test of the A/D conversion circuit 43 and determines which of the temperature control element 71 and the A/D conversion circuit 43 fails based on a result of the self test. That is, the failure detection circuit 13 causes the test voltage generation circuit 60 to output the test voltage VIN, determines that the temperature control element 71 fails if the test code DVIN obtained by converting the test voltage VIN with the A/D conversion circuit 43 is within a normal range, and determines that the A/D conversion circuit 43 fails if the test code DVIN is out of the normal range.

Figure 13:
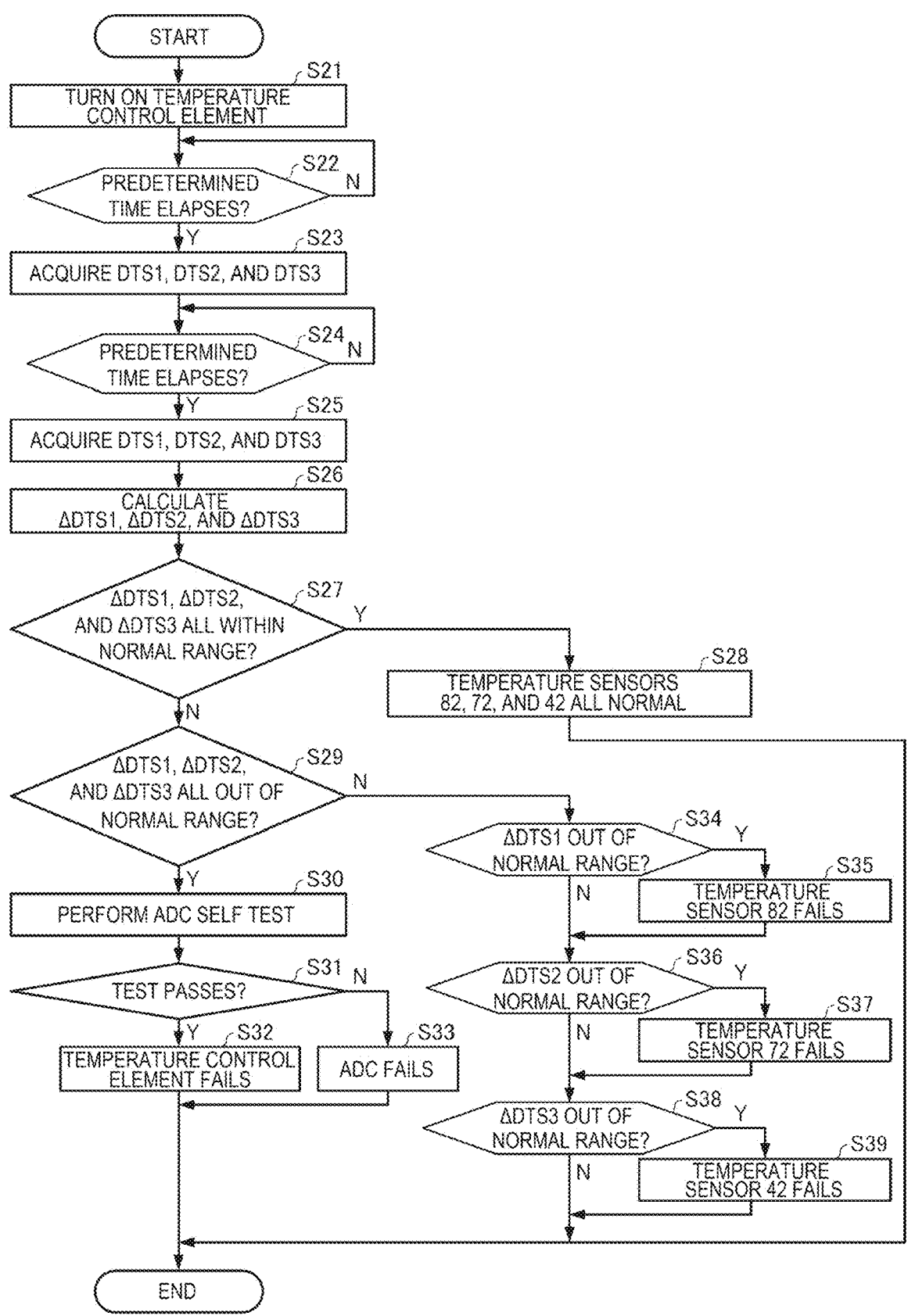
FIG. 13 shows an example of a processing procedure of a failure detection circuit in the second embodiment.

FIG. 13 shows an example of a processing procedure of the failure detection circuit 13 in the second embodiment. As shown in FIG. 13, when the temperature control element 71 is turned on to start an operation in step S21, in step S22, the failure detection circuit 13 stands by until a predetermined time elapses. When the predetermined time elapses in step S22, in step S23, the failure detection circuit 13 acquires the temperature codes DTS1, DTS2, and DTS3. A time point when the predetermined time elapses is a start time point of the above-described predetermined period.

In step S24, the failure detection circuit 13 stands by until the predetermined time elapses. When the predetermined time elapses in step S24, in step S25, the failure detection circuit 13 acquires the temperature codes DTS1, DTS2, and DTS3. A time point when the predetermined time elapses is an end time point of the above-described predetermined period.

In step S26, the failure detection circuit 13 calculates the amounts of change ΔDTS1, ΔDTS2, and ΔDTS3 in the values of the temperature codes DTS1, DTS2, and DTS3 in the predetermined period. Specifically, the failure detection circuit 13 calculates differences between the respective values of the temperature codes DTS1, DTS2, and DTS3 acquired in step S25 and the respective values of the temperature codes DTS1, DTS2, and DTS3 acquired in step S23 as the amounts of change ΔDTS1, ΔDTS2, and ΔDTS3.

In step S27, the failure detection circuit 13 determines whether the amounts of change ΔDTS1, ΔDTS2, and ΔDTS3 are all within the normal range. If the amounts of change ΔDTS1, ΔDTS2, and ΔDTS3 are all within the normal range in step S27, in step S28, the failure detection circuit 13 determines that the temperature sensors 82, 72, and 42 are all normal.

On the other hand, if at least one of the amounts of change ΔDTS1, ΔDTS2, and ΔDTS3 is out of the normal range in step S27, in step S29, the failure detection circuit 13 determines whether the amounts of change ΔDTS1, ΔDTS2, and ΔDTS3 are all out of the normal range.

If at least one of the amounts of change ΔDTS1, ΔDTS2, and ΔDTS3 is within the normal range in step S29, when the amount of change ΔDTS1 is out of the normal range in step S34, in step S35, the failure detection circuit 13 determines that the temperature sensor 82 fails. When the amount of change ΔDTS2 is out of the normal range in step S36, in step S37, the failure detection circuit 13 determines that the temperature sensor 72 fails. When the amount of change $\Delta$DTS3 is out of the normal range in step S38, in step S39, the failure detection circuit 13 determines that the temperature sensor 42 fails. The failure detection circuit 13 determines that a temperature sensor that is not determined to fail among the temperature sensors 82, 72, and 42 is normal.

On the other hand, if the amounts of change $\Delta$DTS1, $\Delta$DTS2, and $\Delta$DTS3 are all out of the normal range in step S29, in step S30, the failure detection circuit 13 performs the self test of the A/D conversion circuit 43.

When the self test passes in step S31, in step S32, the failure detection circuit 13 determines that the temperature control element 71 fails. On the other hand, when the self test does not pass in step S31, in step S33, the failure detection circuit 13 determines that the A/D conversion circuit 43 fails.

According to the oscillator 1 in the second embodiment described above, the same effects as those of the oscillator 1 in the first embodiment are obtained.

In the oscillator 1 in the second embodiment, if the temperature sensors 82, 72, and 42 are normal in the control IC 4, the amounts of change $\Delta$DTS1, $\Delta$DTS2, and $\Delta$DTS3 in the temperature codes DTS1, DTS2, and DTS3 are within the normal range in the predetermined period within the period from when the temperature control element 71 starts to operate to when the temperature of the temperature control element 71 stabilizes. Therefore, the failure detection circuit 13 can detect the failure of the temperature sensors 82, 72, and 42 based on the amounts of change $\Delta$DTS1, $\Delta$DTS2, and $\Delta$DTS3.

3. Third Embodiment

Hereinafter, in a third embodiment, the same reference signs are given to similar configurations as those in the first embodiment and the second embodiment, similar description as those in the first embodiment and the second embodiment will be omitted or simplified, and contents different from those in the first embodiment and the second embodiment will be mainly described.

Since a structure of the oscillator 1 in the third embodiment is the same as that in FIGS. 1 to 4, illustration and description thereof are omitted. A functional block diagram of the oscillator 1 in the third embodiment is the same as that in FIG. 5, and thus illustration and description thereof are omitted. However, in the third embodiment, processing of the failure detection circuit 13 is different from those in the first embodiment and the second embodiment.

In the first embodiment, when the temperature of the temperature control element 71 stabilizes, the failure detection circuit 13 determines whether the output values of the temperature sensors 82, 72, and 42 are within the normal range, and when the output values are all within the normal range, it is determined that the temperature sensors 82, 72, and 42 are normal. In the second embodiment, the failure detection circuit 13 determines whether the amounts of change in the output values of the temperature sensors 82, 72, and 42 in the predetermined period within the period until the temperature of the temperature control element 71 stabilizes are within the normal range, and determines that the temperature sensors 82, 72, and 42 are normal when the amounts of change are all within the normal range.

However, even when the output values or the amounts of change of the temperature sensors 82, 72, and 42 are all within the normal range, the operation of the oscillator 1 is abnormal if a magnitude relationship thereof is not as expected. Therefore, in the embodiment, the failure detection circuit 13 detects an abnormal state of the oscillator 1 based on the magnitude relationship among the output values of the plurality of temperature sensors 82, 72, and 42. Specifically, the failure detection circuit 13 detects the abnormal state of the oscillator 1 based on a magnitude relationship among the temperature codes DTS1, DTS2, and DTS3 obtained by converting the output values of the temperature sensors 82, 72, and 42 with the A/D conversion circuit 43.

As is clear from FIGS. 1 to 5, the distance between the temperature sensor 72 and the temperature control element 71 is smaller than the distance between the temperature sensor 82 and the temperature control element 71 and the distance between the temperature sensor 42 and the temperature control element 71. The distance between the temperature sensor 42 and the temperature control element 71 is larger than the distance between the temperature sensor 82 and the temperature control element 71 and the distance between the temperature sensor 72 and the temperature control element 71. That is, among the temperature sensors 82, 72, and 42, the temperature sensor 72 is disposed at a position closest to the temperature control element 71 that is a heat source, and the temperature sensor 42 is disposed at a position farthest from the temperature control element 71. Therefore, normally, "value of temperature DTS2>value of temperature code DTS1>value of temperature code DTS3" is satisfied. Therefore, when the values of the temperature codes DTS1, DTS2, and DTS3 do not satisfy this magnitude relationship, the failure detection circuit 13 can determine that the oscillator 1 is abnormal.

Figure 14:
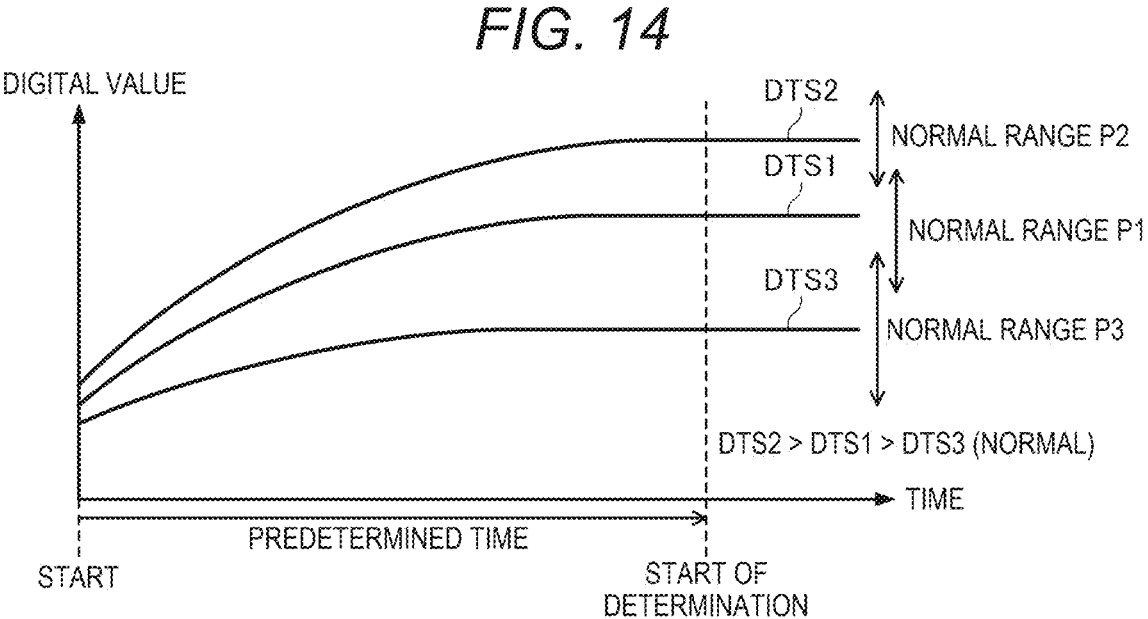
FIG. 14 shows an example of a change over time in a temperature code in a third embodiment.

For example, in the example shown in FIG. 14, since the temperature codes DTS1, DTS2, and DTS3 are within the normal ranges P1, P2, and P3, respectively, and "value of temperature code DTS2>value of temperature code DTS1>value of temperature code DTS3", the failure detection circuit 13 determines that the temperature sensors 82, 72, and 42 are all normal.

Figure 15:
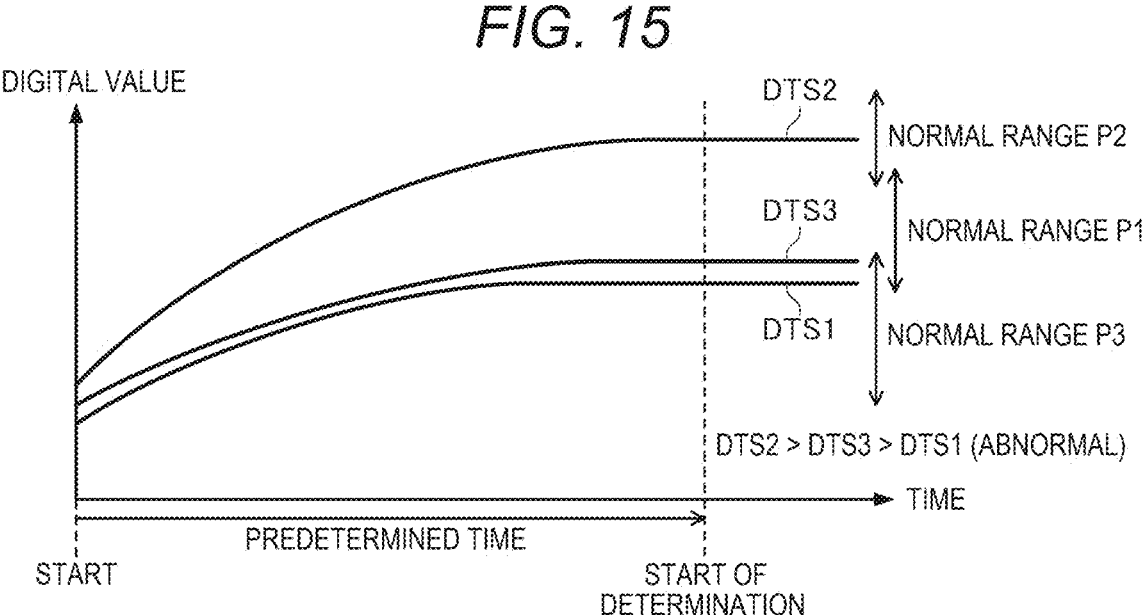
FIG. 15 shows another example of the change over time in the temperature code in the third embodiment.

On the other hand, in the example shown in FIG. 15, although the temperature codes DTS1, DTS2, and DTS3 are within the normal ranges P1, P2, and P3, respectively, since "value of temperature code DTS2>value of temperature code DTS3>value of temperature code DTS1", the failure detection circuit 13 determines that the oscillator 1 is abnormal. Examples of an abnormality in the oscillator 1 include a defect related to thermal insulation performance of the inner package 3, and a case where the temperature of the outside air of the oscillator 1 is equal to or higher than an internal temperature of the inner package 3.

Figure 16:
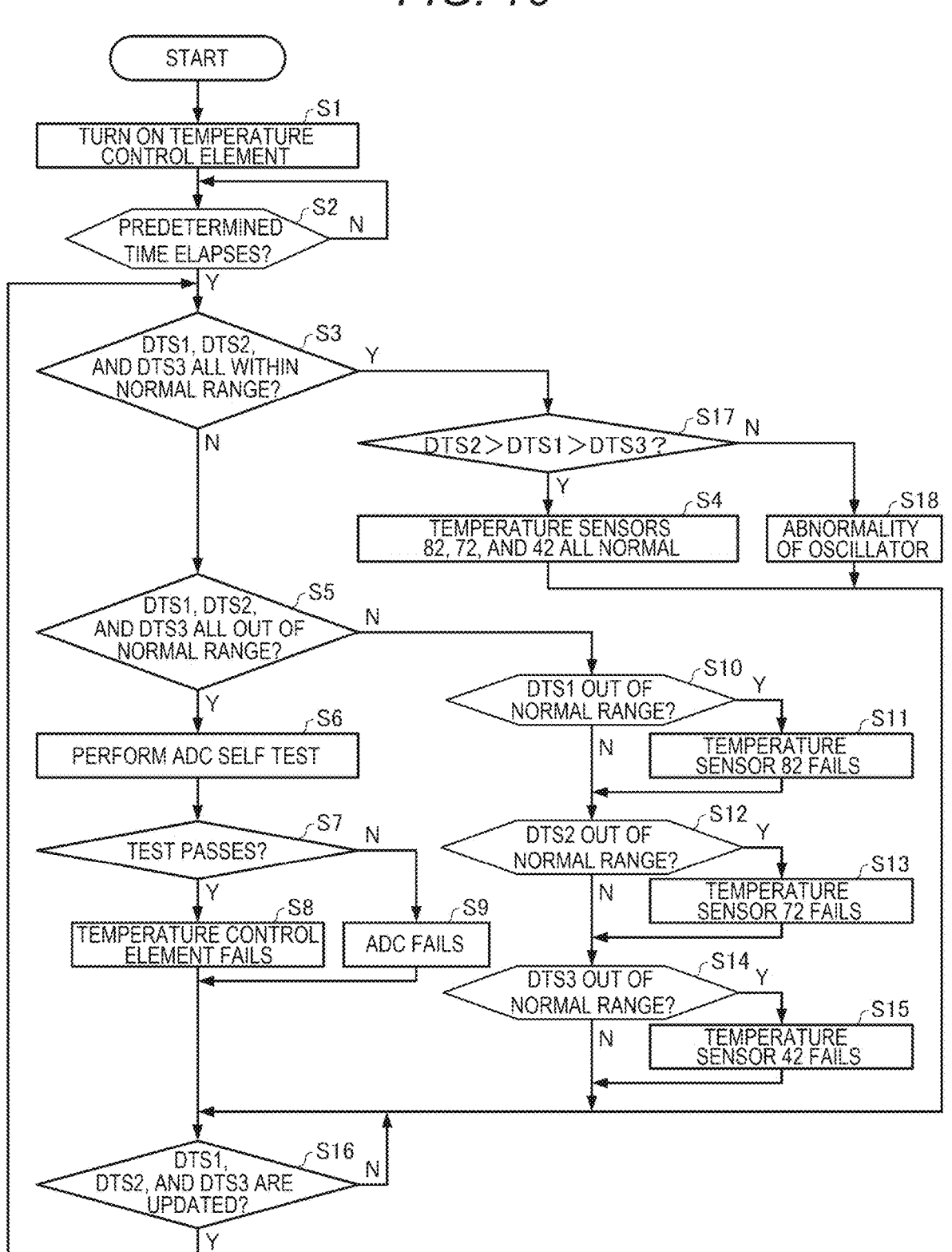
FIG. 16 shows an example of a processing procedure of a failure detection circuit in a third embodiment.

FIG. 16 shows an example of a processing procedure of the failure detection circuit 13 in the third embodiment. In FIG. 16, the same steps as those in FIG. 9 are denoted by the same reference signs. As shown in FIG. 16, when the temperature control element 71 is turned on to start an operation in step S1, in step S2, the failure detection circuit 13 stands by until a predetermined time elapses.

When the predetermined time elapses in step S2, in step S3, the failure detection circuit 13 determines whether the temperature codes DTS1, DTS2, and DTS3 are all within the normal range. If the temperature codes DTS1, DTS2, and DTS3 are all within the normal range in step S3, in step S17, the failure detection circuit 13 determines whether "value of temperature code DTS2>value of temperature code DTS1>value of the temperature code DTS3" is satisfied.

If "value of temperature code DTS2>value of temperature code DTS1>value of temperature code DTS3" is satisfied in step S17, in step S4, the failure detection circuit 13 determines that the temperature sensors 82, 72, and 42 are all normal. If "value of temperature code DTS2>value of temperature code DTS1>value of temperature code DTS3" is not satisfied in step S17, in step S18, the failure detection circuit 13 determines that the oscillator 1 is abnormal.

Since processing of other steps shown in FIG. 16 are the same as the corresponding steps in FIG. 9, description thereof is omitted.

Figure 17:
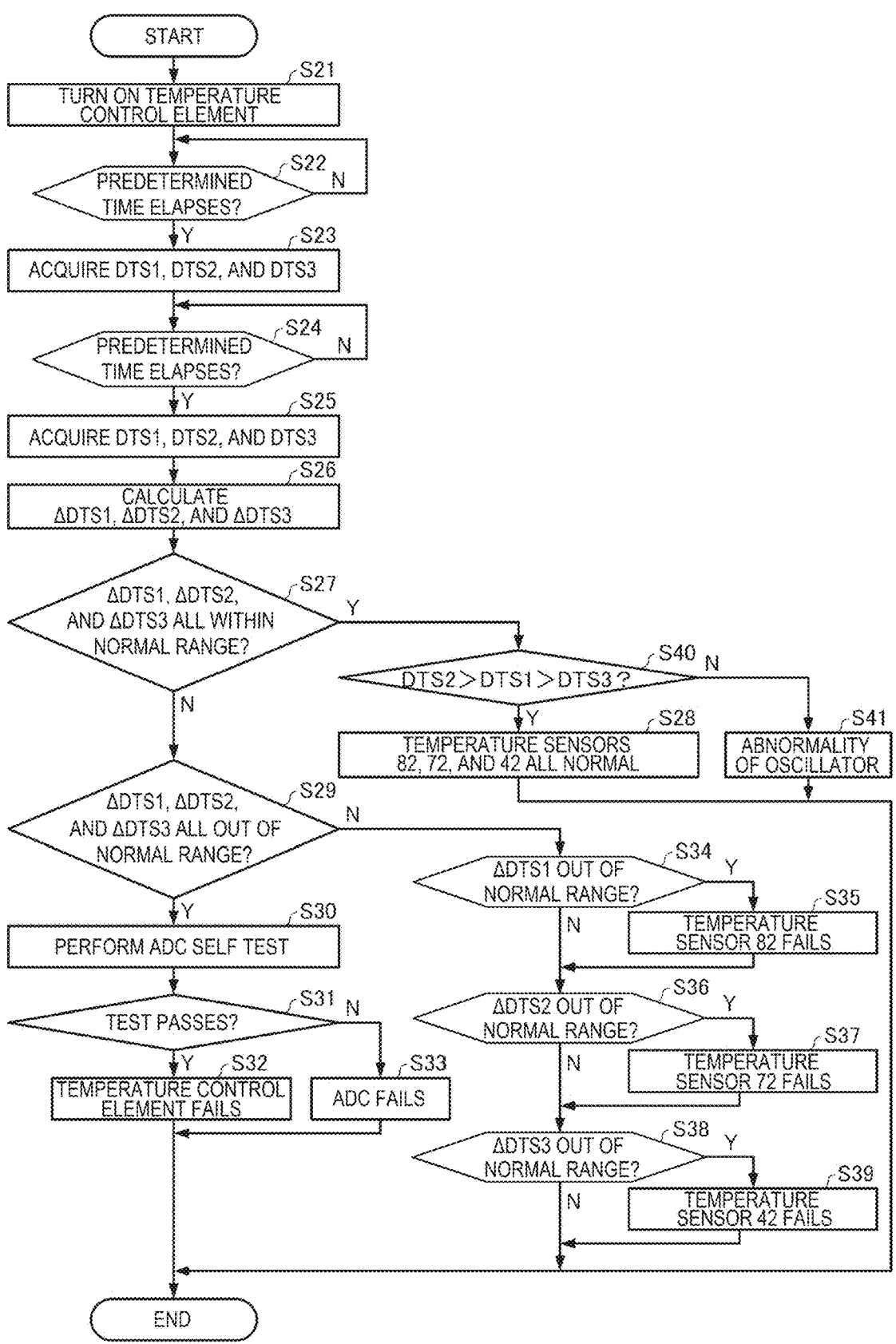
FIG. 17 shows another example of the processing procedure of the failure detection circuit in the third embodiment.

FIG. 17 shows another example of the processing procedure of the failure detection circuit 13 in the third embodiment. In FIG. 17, the same steps as those in FIG. 13 are denoted by the same reference signs. As shown in FIG. 17, when the temperature control element 71 is turned on to start an operation in step S21, in step S22, the failure detection circuit 13 stands by until a predetermined time elapses. When the predetermined time elapses in step S22, in step S23, the failure detection circuit 13 acquires the temperature codes DTS1, DTS2, and DTS3.

In step S24, the failure detection circuit 13 stands by until the predetermined time elapses. When the predetermined time elapses in step S24, in step S25, the failure detection circuit 13 acquires the temperature codes DTS1, DTS2, and DTS3.

In step S26, the failure detection circuit 13 calculates the amounts of change ΔDTS1, ΔDTS2, and ΔDTS3 in the values of the temperature codes DTS1, DTS2, and DTS3 in the predetermined period. Specifically, the failure detection circuit 13 calculates differences between the respective values of the temperature codes DTS1, DTS2, and DTS3 acquired in step S25 and the respective values of the temperature codes DTS1, DTS2, and DTS3 acquired in step S23 as the amounts of change ΔDTS1, ΔDTS2, and ΔDTS3.

In step S27, the failure detection circuit 13 determines whether the amounts of change ΔDTS1, ΔDTS2, and ΔDTS3 are all within the normal range. If the amounts of change ΔDTS1, ΔDTS2, and ΔDTS3 are all within the normal range in step S27, in step S40, the failure detection circuit 13 determines whether "value of temperature code DTS2>value of temperature code DTS1>value of temperature code DTS3" is satisfied.

If "value of temperature code DTS2>value of temperature code DTS1>value of temperature code DTS3" is satisfied in step S40, in step S28, the failure detection circuit 13 determines that the temperature sensors 82, 72, and 42 are all normal. If "value of temperature code DTS2>value of temperature code DTS1>value of temperature code DTS3" is not satisfied in step S40, in step S41, the failure detection circuit 13 determines that the oscillator 1 is abnormal.

Since processing of other steps shown in FIG. 17 are the same as the corresponding steps in FIG. 13, description thereof is omitted.

According to the oscillator 1 in the third embodiment described above, the same effects as those of the oscillator 1 in the first embodiment or the second embodiment are obtained.

In the oscillator 1 in the third embodiment, in a state where the temperature control element 71 operates in the control IC 4, the predetermined magnitude relationship occurs among the temperature codes DTS1, DTS2, and DTS3 due to the positional relationship between the temperature control element 71 and the temperature sensors 82, 72, and 42. Therefore, the failure detection circuit 13 can detect the abnormal state of the oscillator 1 based on the magnitude relationship among the temperature codes DTS1, DTS2, and DTS3.

4. Modification

The disclosure is not limited to the embodiments, and various modifications can be made within the scope of the gist of the disclosure.

In the above embodiments, the oscillator 1 includes the three temperature sensors 82, 72, and 42, the failure detection circuit 13 performs the failure detection based on the output values of the three temperature sensors 82, 72, and 42, but the number of temperature sensors is not limited to three, and may be two or four or more.

In the above embodiments, the temperature control element 71 and the temperature sensor 72 are built in the heat generation IC 7, and alternatively, the temperature control element 71 and the temperature sensor 72 may be provided separately. In the above embodiments, the temperature sensor 82 is built in the oscillation IC 8, and alternatively, the temperature sensor 82 and the oscillation IC 8 may be provided separately. In the above embodiments, the temperature sensor 42 is built in the control IC 4, and alternatively, the temperature sensor 42 and the control IC 4 may be provided separately. In such cases, for example, the temperature sensors 72, 82, and 42 may be thermistors or platinum resistance sensors.

In the above embodiments, the control IC 4 includes one temperature sensor 42, and alternatively, a plurality of temperature sensors may be provided. In this case, for example, the A/D conversion circuit 43 may convert a plurality of temperature detection signals output from the plurality of temperature sensors into a plurality of temperature codes, and the microcontroller 40 may perform temperature control or temperature compensation based on the plurality of temperature codes. For example, the microcontroller 40 may perform temperature control or temperature compensation using an average value of the plurality of temperature codes as the temperature code DTS3.

In the above embodiments, temperature compensation is performed by controlling the division ratio of the fractional-N PLL circuit 45 based on the division ratio control signal DIVC output from the microcontroller 40, but the temperature compensation method is not limited thereto. For example, the oscillation circuit 81 built in the oscillation IC 8 may include a capacitor array, and the temperature compensation may be performed by selecting a capacitance value of the capacitor array based on a temperature compensation code DCMP calculated by the microcontroller 40. For example, the oscillation circuit 81 may include a variable capacitance element for adjusting a frequency, and the temperature compensation may be performed by converting the temperature compensation code DCMP calculated by the microcontroller 40 into an analog signal with the D/A conversion circuit and controlling a capacitance value of the variable capacitance element based on the analog signal.

In the above embodiments, one A/D conversion circuit 43 converts voltages of the temperature detection signals TS1, TS2, TS3, and the test voltage VIN into the temperature codes DTS1, DTS2, DTS3, and the test code DVIN in a time-division manner, respectively, and for example, the control IC 4 may include a plurality of A/D conversion circuits, and the plurality of A/D conversion circuits may convert the voltages of the temperature detection signals TS1, TS2, TS3, and the test voltage VIN into the temperature codes DTS1, DTS2, DTS3, and the test code DVIN, respectively.

In the above embodiments, the temperature control element 71 is a heat generation element such as a CMOS transistor, and as long as the temperature control element 71 is an element that can control the temperature of the resonator element 6, the temperature control element 71 may be a heat absorbing element such as a Peltier element depending on a relationship between the target set temperature of the temperature of the resonator element 6 and the outside air temperature.

The embodiments and the modifications described above are examples, and the disclosure is not limited thereto. For example, the embodiments and the modifications may be combined as appropriate.

The disclosure includes configurations that are substantially identical to the configurations described in the embodiments, for example, configurations having the same function, method, and result, or configurations having the same object and effect. The disclosure includes configurations obtained by replacing non-essential portions of the configurations described in the embodiments. The disclosure includes configurations that can obtain the same function and effect and configurations that can accomplish the same object as the configurations described in the embodiments. The disclosure includes configurations obtained by adding a known technique to the configurations described in the embodiments.

The following contents are derived from the embodiments and the modifications described above.

An aspect of an oscillator includes:

a resonator element;

an oscillation circuit configured to cause the resonator element to oscillate;

a temperature control element configured to control a temperature of the resonator element;

a plurality of temperature sensors;

a failure detection circuit; and a container configured to accommodate the resonator element, the oscillation circuit, the temperature control element, the plurality of temperature sensors, and the failure detection circuit, in which the failure detection circuit performs failure detection for the plurality of temperature sensors and the temperature control element based on output values of the plurality of temperature sensors in a state where the temperature control element operates.

According to this oscillator, in the state where the temperature control element operates, a difference occurs between the output values of the plurality of temperature sensors due to a positional relationship between the temperature control element and the plurality of temperature sensors, and the failure detection circuit can detect a failure of the plurality of temperature sensors based on the output values of the plurality of temperature sensors.

According to an aspect of the oscillator, the failure detection circuit may determine whether the output values of the plurality of temperature sensors are within a normal range, and perform the failure detection based on a determination result.

In this oscillator, if each of the plurality of temperature sensors is normal, each of the output values of the plurality of temperature sensors is within the normal range in the state where the temperature control element operates. Therefore, according to the oscillator, the failure detection circuit can determine whether each of the output values of the plurality of temperature sensors is within the normal range, and can detect the failure of the plurality of temperature sensors based on the determination result.

According to an aspect of the oscillator, the failure detection circuit may perform the failure detection based on an amount of change in the output values of the plurality of temperature sensors in a predetermined period within a period from when the temperature control element starts to operate to when a temperature of the temperature control element stabilizes.

In this oscillator, if each of the plurality of temperature sensors is normal, the amount of change in each of the output values of the plurality of temperature sensors is within the normal range in the predetermined period within the period from when the temperature control element starts to operate to when the temperature of the temperature control element stabilizes. Therefore, according to the oscillator, the failure detection circuit can detect the failure of the plurality of temperature sensors based on the amount of change in the output values of the plurality of temperature sensors in the predetermined period.

An aspect of the oscillator may include:

an A/D conversion circuit configured to perform A/D conversion on each of the output values of the plurality of temperature sensors to generate a plurality of pieces of temperature data.

According to an aspect of the oscillator, the failure detection circuit may determine, when a value of the temperature data corresponding to an output value of at least one temperature sensor among the plurality of temperature sensors is normal and a value of the temperature data corresponding to an output value of another temperature sensor is abnormal, that the another temperature sensor fails, and determine, when all of the plurality of pieces of temperature data are out of a normal range, that the temperature control element or the A/D conversion circuit fails.

According to the oscillator, since a possibility that all of the plurality of temperature sensors simultaneously fail is extremely small, the failure detection circuit can determine that the temperature control element or the A/D conversion circuit fails when all of the plurality of pieces of temperature data are out of the normal range.

According to an aspect of the oscillator, the failure detection circuit may perform a self test of the A/D conversion circuit when all of the pieces of temperature data are out of the normal range, and determine which of the temperature control element and the A/D conversion circuit fails based on a result of the self test.

In this oscillator, when all of the plurality of pieces of temperature data are out of the normal range, it is considered that the A/D conversion circuit fails if the self test of the A/D conversion circuit does not pass and that the temperature control element fails if the self test of the A/D conversion circuit passes. Therefore, according to the oscillator, the failure detection circuit can determine which of the temperature control element and the A/D conversion circuit fails.

According to an aspect of the oscillator, the failure detection circuit may detect an abnormal state of the oscillator based on a magnitude relationship between the output values of the plurality of temperature sensors.

In this oscillator, in the state where the temperature control element operates, a difference occurs between the output values of the plurality of temperature sensors due to a positional relationship between the temperature control element and the plurality of temperature sensors, and a predetermined magnitude relationship occurs between the output values of the plurality of temperature sensors. Therefore, according to the oscillator, the failure detection circuit can detect the abnormal state of the oscillator based on the magnitude relationship between the output values of the plurality of temperature sensors.

According to an aspect of the oscillator, the plurality of temperature sensors may include a first temperature sensor, a second temperature sensor, and a third temperature sensor, the first temperature sensor may detect a temperature of the oscillation circuit, the second temperature sensor may detect a temperature of the temperature control element, and a distance between the third temperature sensor and the temperature control element may be larger than a distance between the first temperature sensor and the temperature control element and a distance between the second temperature sensor and the temperature control element.

In this oscillator, in the state where the temperature control element operates, a difference between the temperature detected by the second temperature sensor and the temperature of the temperature control element is smallest, a difference between the temperature detected by the first temperature sensor and the temperature of the temperature control element is second smallest, and a difference between the temperature detected by the third temperature sensor farthest from the temperature control element and the temperature of the temperature control element is largest among the first temperature sensor, the second temperature sensor, and the third temperature sensor. Therefore, according to the oscillator, the failure detection circuit can detect the failure of the first temperature sensor, the second temperature sensor, and the third temperature sensor based on the output values of the first temperature sensor, the second temperature sensor, and the third temperature sensor.

According to an aspect of the oscillator, the temperature control element may be a heat generation element.

What is claimed is:

1. An oscillator comprising:

a resonator element;

an oscillation circuit configured to cause the resonator element to oscillate;

a temperature control element configured to control a temperature of the resonator element;

a plurality of temperature sensors;

a failure detection circuit; and a container configured to accommodate the resonator element, the oscillation circuit, the temperature control element, the plurality of temperature sensors, and the failure detection circuit, wherein the failure detection circuit performs failure detection for the plurality of temperature sensors and the temperature control element based on output values of the plurality of temperature sensors in a state where the temperature control element operates.

2. The oscillator according to claim 1, wherein the failure detection circuit determines whether the output values of the plurality of temperature sensors are within a normal range, and performs the failure detection based on a determination result.

3. The oscillator according to claim 1, wherein the failure detection circuit performs the failure detection based on an amount of change in the output values of the plurality of temperature sensors in a predetermined period within a period from when the temperature control element starts to operate to when a temperature of the temperature control element stabilizes.

4. The oscillator according to claim 1, further comprising:

an A/D conversion circuit configured to perform A/D conversion on each of the output values of the plurality of temperature sensors to generate a plurality of pieces of temperature data.

5. The oscillator according to claim 4, wherein the failure detection circuit determines, when a value of the temperature data corresponding to an output value of at least one temperature sensor among the plurality of temperature sensors is normal and a value of the temperature data corresponding to an output value of another temperature sensor is abnormal, that the another temperature sensor fails, and determines, when all of the plurality of pieces of temperature data are out of a normal range, that the temperature control element or the A/D conversion circuit fails.

6. The oscillator according to claim 5, wherein the failure detection circuit performs a self test of the A/D conversion circuit when all of the pieces of temperature data are out of the normal range, and determines which of the temperature control element and the A/D conversion circuit fails based on a result of the self test.

7. The oscillator according to claim 1, wherein the failure detection circuit detects an abnormal state of the oscillator based on a magnitude relationship between the output values of the plurality of temperature sensors.

8. The oscillator according to claim 1, wherein the plurality of temperature sensors include a first temperature sensor, a second temperature sensor, and a third temperature sensor, the first temperature sensor detects a temperature of the oscillation circuit, the second temperature sensor detects a temperature of the temperature control element, and a distance between the third temperature sensor and the temperature control element is larger than a distance between the first temperature sensor and the temperature control element and a distance between the second temperature sensor and the temperature control element.

9. The oscillator according to claim 1, wherein the temperature control element is a heat generation element.

* * * * *